United States Patent [19]

Okuda et al.

[11] Patent Number: 5,249,356
[45] Date of Patent: Oct. 5, 1993

[54] METHOD AND APPARATUS FOR MOUNTING ELECTRONIC COMPONENT

[75] Inventors: Osamu Okuda; Wataru Hirai; Shiro Oji, all of Osaka; Minoru Yamamoto, Hyogo, all of Japan

[73] Assignee: Matsushita Electric Industrial Co., Ltd., Osaka, Japan

[21] Appl. No.: 853,993

[22] Filed: Mar. 19, 1992

[30] Foreign Application Priority Data

Mar. 20, 1991 [JP] Japan .................. 3-056606

[51] Int. Cl.$^5$ .......................... H05K 3/30; B23P 19/00
[52] U.S. Cl. ........................... 29/833; 29/740; 29/741; 29/759
[58] Field of Search .............. 29/833, 840, 846, 740, 29/741, 759

[56] References Cited

U.S. PATENT DOCUMENTS

| | | | |
|---|---|---|---|
| 4,951,383 | 8/1990 | Amao et al. | 29/833 X |
| 4,979,290 | 12/1990 | Chiba | 29/840 |
| 4,980,971 | 1/1991 | Bartschat et al. | 29/833 |
| 5,044,072 | 9/1991 | Blais et al. | 29/833 X |
| 5,084,959 | 2/1992 | Ando et al. | 29/846 X |
| 5,084,962 | 2/1992 | Takahashi et al. | 29/833 |
| 5,086,559 | 2/1992 | Akatsuchi | 29/833 X |
| 5,115,559 | 5/1992 | Oyama | 29/833 X |

FOREIGN PATENT DOCUMENTS 3-110897  5/1991  Japan .

Primary Examiner—Carl J. Arbes
Attorney, Agent, or Firm—Wenderoth, Lind & Ponack

[57] ABSTRACT

An electronic component mounting apparatus includes a table for feeding in and out a printed circuit board and holding the board thereon, a supply section for supplying an electronic component, a head portion for suctioning the component thereto and mounting the component on the board, an XY-robot for placing the head portion at an arbitrary position, a suction device for suctioning the component thereto, arranged at the head portion and vertically moving with respect to the head portion, and having a function of placing the component in a rotational direction thereof, a recognizing camera for recognizing the component and measuring an error amount of a position of the component before and after correction of the position of the component, and a controller for controlling the head portion, the XY-robot, and the camera. The error amount of the position of the component is measured after the suction device suctions the component thereto, the position of the component is again measured after the correction of an erroneous position of the component in the rotational direction is accomplished, and the component is mounted on the board after the correction of the erroneous position of the component is accurately accomplished.

7 Claims, 4 Drawing Sheets

METHOD AND APPARATUS FOR MOUNTING ELECTRONIC COMPONENT

BACKGROUND OF THE INVENTION

The present invention relates to a method and an apparatus for mounting an electronic component on a printed circuit board.

In recent years, the electronic circuit board has become highly dense and highly functional, and the individual integrated circuit electronic components have become highly functional as well. An increasing number of output pins are mounted on the electronic circuit board and consequently, the interval between output pins is becoming narrower and narrower. Under these circumstances in particular, it is required in particular that an electronic component be mounted accurately on the electronic circuit board by rotating the component to an accurate angle before the component is mounted.

An example of a conventional electronic component mounting is described below with reference FIG. 4. The apparatus comprises a table 2 for feeding a printed circuit board 1 into the apparatus and feeding the printed circuit board 1 therefrom and holding the printed circuit board 1 thereon; a supply section 3 for supplying the electronic component 6 to the printed circuit board 1; a head portion 5 for suctioning the electronic component 6 thereto and mounting the component on the printed circuit board 1; an XY-robot 4 for positioning the head portion 5 at an arbitrary position; a recognizing camera 21 for measuring the error amount of the position of the electronic component 6 suctioned by the head portion 5; and a controller 7 for sequence-controlling the apparatus.

The operation of the apparatus constructed as above is described below with reference to FIGS. 4 and 5.

The table 2 feeds the printed circuit board 1 to the center portion of the apparatus, thus holding the printed circuit board 1 therein. The XY-robot 4 moves the head portion 5 to the supply section 3 carrying the electronic component 6. The head portion 5 moves downward, thus suctioning the electronic component 6 thereto (step #11 in FIG. 5). Then, the XY-robot 4 moves the head portion 5 to a position above the end portion of the recognizing camera 21. The recognizing camera 21 recognizes the electronic component 6 (step #12) and measures the position of the head portion 5 and that of the electronic component 6 so as to calculate the positional error amount of the electronic component 6 in the rotational direction thereof (step #13). The recognizing camera 21 and the XY-robot 4 correct the positional error of the electronic component 6 in the rotational direction thereof and in the XY-direction thereof, respectively, while the XY-robot 4 is moving the head portion 5 toward an electronic component mounting position of the printed circuit board 1 (step #14). In this manner, the electronic component 6 is mounted on the printed circuit board 1 (step #15). Thereafter, the printed circuit board 1 is fed out from the apparatus by the table 2. The controller 7 performs the sequence control of the apparatus.

According to the above-described conventional construction, the positional error amount of the electronic component 6 in XY-direction is measured with the XY-robot 4 stopping the nozzle 8 of the head portion 5 above the recognizing camera 15, and the positional error amount of the electronic component 6 in the rotational direction thereof is measured with the XY-robot 4 moving the nozzle 8. Thus, the electronic component 6 is mounted on the printed circuit board 1 without checking whether or not the erroneous position of the electronic component 6 has been corrected accurately.

SUMMARY OF THE INVENTION

It is an essential object of the present invention to provide a method and an apparatus for mounting an electronic component, capable of reliably correcting the positional error of an electronic component held by a head portion in the rotational direction of the electronic component and mounting the component in the position on a printed circuit board.

In accomplishing these and other objects, according to one aspect of the present invention, there is provided an electronic component mounting apparatus comprising:

a table for feeding in and out a printed circuit board and holding the printed circuit board thereon;

a supply section for supplying an electronic component;

a head portion for suctioning the electronic component thereto and mounting the electronic component on the printed circuit board;

an XY-robot for placing the head portion at an arbitrary position;

a suction means, for suctioning the electronic component thereto, arranged at the head portion, and vertically moving with respect to the head portion, and having a function of placing the electronic component in a rotational direction thereof;

a recognizing camera for recognizing the electronic component, and measuring an error amount of a position of the electronic component before and after correction of the position of the electronic component; and a controller for controlling the head portion, the XY-robot, and the recognizing camera to measure using the recognizing camera the error amount of the position of the electronic component after the suction means suctions the electronic component thereto, to measure using the recognizing camera the position of the electronic component again after the correction of an erroneous position of the electronic component in the rotational direction is accomplished, and to mount the electronic component on the printed circuit board after the correction of the erroneous position of the electronic component is accurately accomplished.

According to another aspect of the present invention, there is provided an electronic component mounting method for mounting an electronic component on a printed circuit board after correction of a position of the electronic component, comprising the steps of:

suctioning the electronic component supplied to a supply section to a suction means;

placing a head portion of an electronic component mounting apparatus at an arbitrary position by an XY-robot, the head portion having the suction means;

moving the suction means with respect to the head portion so that the electronic component is placed in a rotational direction thereof;

recognizing the electronic component and measuring an error amount of the position of the electronic component by a recognizing camera after the suction means suctions the electronic component thereto;

measuring using the camera, the position of the electronic component again after the correction of an erroneous position of the electronic component in the rotational direction is accomplished; and mounting the electronic component on the printed circuit board after the correction of the erroneous position of the electronic component is accurately accomplished.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE EMBODIMENT

Figure 1:
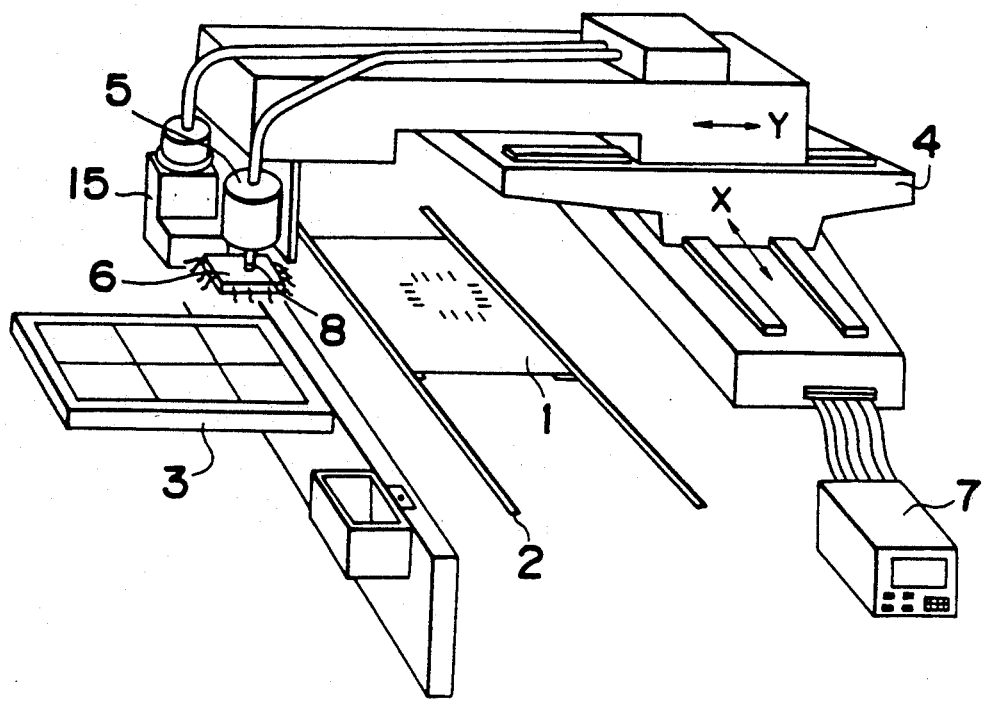
FIG. 1 is a perspective view showing the concept of the construction of an electronic component mounting apparatus according to an embodiment of the present invention.

Before the description of the present invention proceeds, it is to be noted that like parts are designated by like reference numerals throughout the accompanying drawings.

An embodiment of the present invention is described below with reference to FIGS. 1 through 3.

Figure 2:
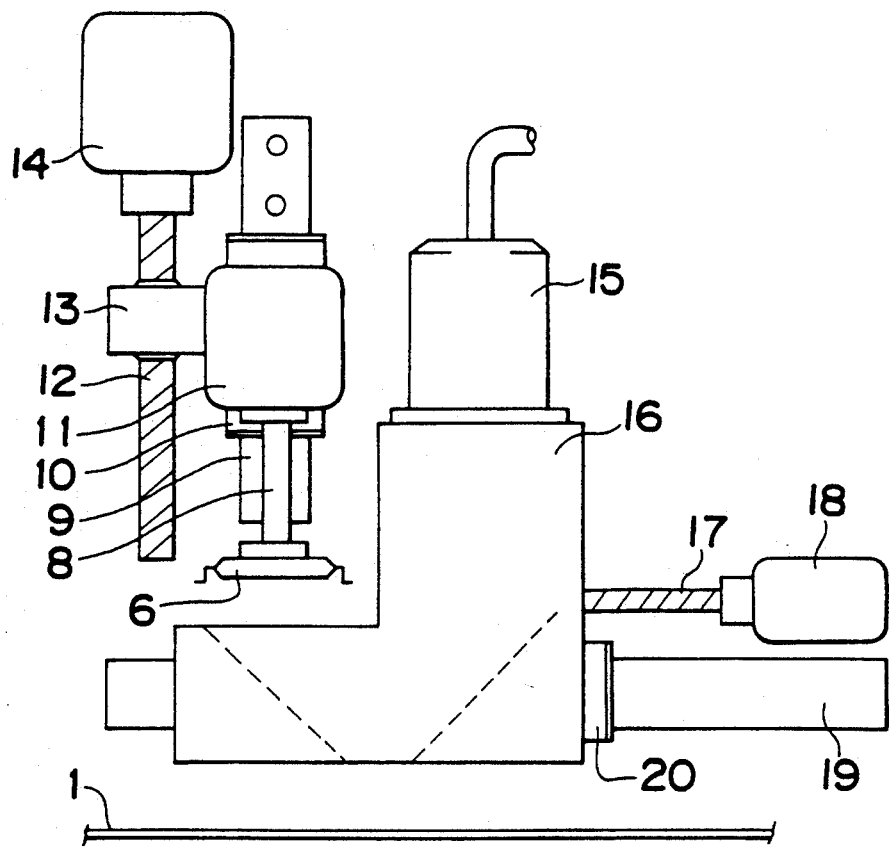
FIG. 2 is a front view showing a head portion and a recognizing camera of the electronic component mounting apparatus of FIG. 1.
Figure 3:
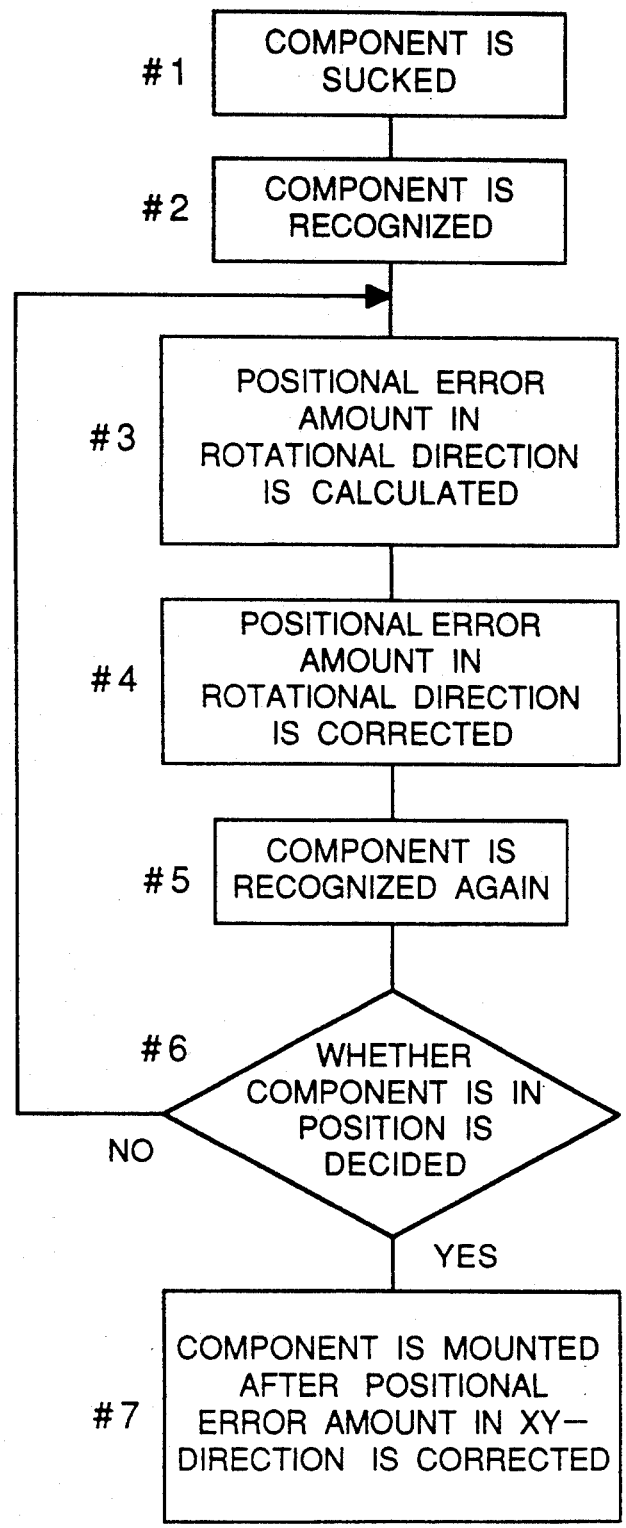
FIG. 3 is a flowchart showing a process for mounting an electronic component on a printed circuit board to be carried out by the apparatus.
Figure 4:
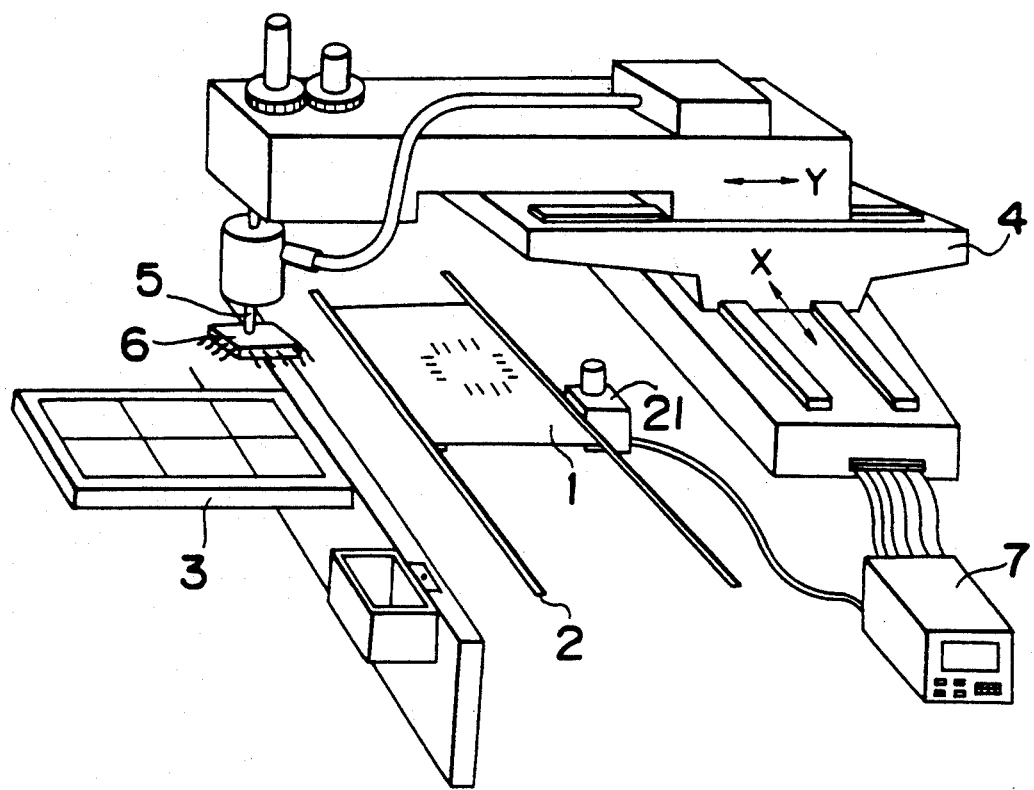
FIG. 4 is a perspective view showing the concept of the construction of a conventional electronic component mounting apparatus.
Figure 5:
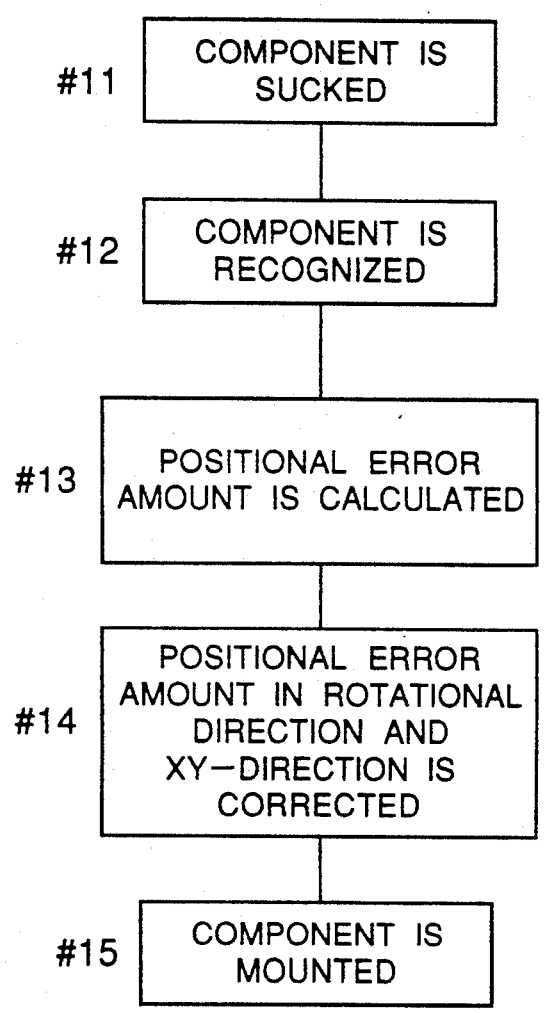
FIG. 5 is a flowchart showing a process for mounting an electronic component on a printed circuit board to be carried out by the conventional apparatus of FIG. 4.

As shown in FIG. 2, a nozzle 8 for suctioning an electronic component 6 thereto is fixed to a motor 11 for positioning the rotational angle of the head portion 5. The motor 11 is fixed to a mover 10 which slidably moves on a rail 9. The mover 10 is fixed by a nut 13 which moves vertically with the rotation of a ball thread 12 driven by a motor 14. Therefore, the nozzle 8 moves vertically in the head portion 5 and has a function of positioning the electronic component 6 in the rotational direction thereof.

A recognizing camera 15 inputs the image of the electronic component 6 through a lens and a prism of an optical system 16. The optical system 16 is fixed to a mover 20 which slidably moves on a rail 19. The mover 20 slides horizontally through a nut (not shown) and a ball thread 17 which is rotated by a motor 18. According to the above construction, the optical system 16 moves to an image input position where the end of the optical system 16 is below the nozzle 8 when the optical system 16 inputs the image of the electronic component 6 and moves away from the image input position when the nozzle portion 8 suctions the electronic component 6 thereto and mounts the electronic component 6 on the printed circuit board 1.

The operation of the apparatus constructed as above is described below with reference to FIGS. 1 through 3.

The table 2 feeds the printed circuit board 1 into the apparatus, thus holding the printed circuit board 1 in the center portion of the apparatus. The XY-robot 4 moves the head portion 5 to a position above the supply section 3 and the motor 14 drives the nozzle 8 downward so that a vacuum-suctioning device (not shown) suctions the electronic component 6 to the nozzle 8 (step #1 in FIG. 3). While the XY-robot 4 is moving the head portion 5 to a position above the printed circuit board 1, the motor 18 drives the optical system 16 to the image input position so that the recognizing camera 15 recognizes the image of the electronic component 6 (step #2). Based on the recognized image, the positional error amount of the electronic component 6 is calculated (step #3) and then, the motor 11 corrects the position of the electronic component 6 in the rotational direction thereof under the control of the controller 7 (step #4). Then, the recognizing camera 15 recognizes the image of the electronic component 6 again (step #5) so that based on the recognized image, the controller 7 decides (step #6) whether or not the correction of the erroneous position of the electronic component 6 in the rotational direction has been accomplished accurately. If the erroneous position of the electronic component 6 in the rotational direction has not been corrected accurately, the motor 11 is driven under the control of the controller 7 to again correct the rotational direction of the electronic component 6 again. These operations are repeatedly carried out until the erroneous rotational position of the electronic component 6 is corrected.

After the correction of the erroneous electronic component 6 in the rotational direction is performed, the motor 18 drives the optical system 16 to move away from the image input position. While the XY-robot 4 is moving the head portion 5 toward the printed circuit board 1, the erroneous position of the electronic component 6 in the XY-direction is calculated based on the most recent inputted image of the electronic component 6 picked up by the recognizing camera 15 and the XY-robot 4 corrects the erroneous position of the electronic component 6 in XY-direction, thus mounting the electronic component 6 on the printed circuit board 1 (step #7). Then, the printed circuit board 1 is fed out from the apparatus by the table 2. These operations are performed sequentially by the controller 7.

As described above, this construction allows the correction of the erroneous position of the electronic component in the rotational direction to be accurately performed and as such allows the electronic component to be mounted on the printed circuit board at an accurate position thereof. After the correction of the erroneous position of the electronic component in the rotational direction thereof is made, the erroneous position of the electronic component in the XY-direction is detected based on the information of the position of the electronic component in the rotational direction thereof. Then, the XY-robot corrects the erroneous position of the electronic component in the XY-direction. Thus, the electronic component can be reliably mounted on the printed circuit board.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting method comprising:

a first step of causing a suction device to suction an electronic component;

a second step of using a camera, which is movable with the suction device responsive to the movement of a robot arm, to obtain an image of the electronic component suctioned by the suction device;

a third step of determining a positional error of the electronic component in a rotational direction based on the image obtained in said second step;

a fourth step of rotating the suction device to correct the positional error of the electronic component determined in said third step;

a fifth step of repeating said second through fourth steps to correct any remaining positional error of the electronic component after said fourth step;

a sixth step of mounting the electronic component to a printed circuit board after correcting the positional error of the electronic component in said first through fifth steps.

2. An electronic component mounting method as recited in claim 1, further comprising, after said fifth step and prior to said sixth step, the steps of determining a positional error of the electronic component relative to X and Y directions which extend in a same horizontal plane and along which the robot arm is movable, and moving the robot arm to correct the positional error of the electronic component relative to the X and Y directions.

3. An electronic component mounting apparatus comprising:

a table for holding a printed circuit board and for conveying the printed circuit board to a mounting position;

a supply section containing an electronic component;

an X-Y robot, operatively associated with said table and said supply section, having an arm member movable in X and Y directions which extend in a same horizontal plane;

a suctioning device, fixed to said arm member of said X-Y robot, having a suction nozzle and first drive means for vertically moving said suction nozzle to suction the electronic component contained in said supply section and second drive means for rotating said suction nozzle in a rotational direction about a rotational axis of said second drive means;

a recognizing camera, fixed to said arm member of said X-Y robot, for obtaining an image of the electronic component suctioned by said suction nozzle of said suctioning device;

a controller means, operatively coupled to said X-Y robot and said suctioning device and said recognizing camera, for initially determining a positional error of the electronic component in the rotational direction using an image obtained by said recognizing camera, for driving said second drive means of said suctioning device to correct the positional error of the electronic component in the rotational direction, for determining if a remaining positional error of the electronic component in the rotational direction is present using an image obtained by said recognizing camera after driving said second drive means, for again driving said second drive means to correct the remaining positional error of the electronic component in the rotational direction, and for causing the X-Y robot to move the electronic component suctioned by said suction nozzle to mount the electronic component on the printed circuit board.

4. An electronic component mounting apparatus as recited in claim 3, wherein said controller means is further for determining a positional error relative to the X and Y directions of the electronic component suctioned by said suction nozzle using the image obtained by said recognizing camera, and for moving the arm member of the X-Y robot to correct the positional error relative to the X and Y directions of the electronic component.

5. An electronic component mounting apparatus as recited in claim 3, further comprising third drive means, fixed to said arm member of said X-Y robot, for moving said camera in a direction parallel to said horizontal plane.

6. An electronic component mounting apparatus as recited in claim 4, further comprising third drive means, fixed to said arm member of said X-Y robot, for moving said camera in a direction parallel to said horizontal plane.

7. An electronic component mounting apparatus comprising:

a table for holding a printed circuit board and for conveying the printed circuit board to a mounting position;

a supply section containing an electronic component;

an X-Y robot, operatively associated with said table and said supply section, having an arm member movable in X and Y directions which extend in a same horizontal plane;

a suctioning device, fixed to said arm member of said X-Y robot, having a suction nozzle and first drive means for vertically moving said suction nozzle to suction the electronic component contained in said supply section and second drive means for rotating said suction nozzle in a rotational direction about a rotational axis;

a recognizing camera device, fixed to said arm member of said X-Y robot, having a camera and third drive means for moving said camera in a direction parallel to said horizontal plane to position said camera to obtain an image of the electronic component suctioned by said suction nozzle of said suctioning device; and controller means for controlling said X-Y robot and said suctioning device to mount the electronic component on the printed circuit board using the image of the electronic component obtained by said recognizing camera device.

* * * * *